US004001741B2

United States Statutory Invention Registration [19]

[11] Reg. Number: H1741

Cruts

[45] Published: Jul. 7, 1998

[54] METHOD AND APPARATUS FOR PATTERN SENSITIVITY STRESS TESTING OF MEMORY SYSTEMS

[75] Inventor: Melvin Lee Cruts, Milpitas, Calif.

[73] Assignee: Tandem Computers Corporation, Cupertino, Calif.

[21] Appl. No.: 349,520

[22] Filed: Dec. 5, 1994

[51] Int. Cl.[6] ..... H01L 31/0328; G11C 29/00

[52] U.S. Cl. ..... 371/21.3; 371/21.1; 371/21.2; 371/15.1

[58] Field of Search ..... 365/201, 200; 371/21.1, 21.2, 21.3, 15.1

[56] References Cited

U.S. PATENT DOCUMENTS 5,375,091 12/1994 Berry, Jr. et al. ..... 365/201

OTHER PUBLICATIONS

Article by Abadir et al., entitled "Functional Testing of Semiconductor Random Access Memories" published by *Computing Surveys*, vol. 15, No. 3, Sep. 1983.

Article by Knaizuk et al., entitled "An Optimal Algorithm for Testing Stuck-at Faults in Random Access Memories" published by *IEEE Transaction on Computing*, vol. C-26, No. 11, Nov. 1977 pp. 1141-1144.

*Primary Examiner*—Bernarr E. Gregory
*Attorney, Agent, or Firm*—Graham & James LLP

[57] ABSTRACT

A method and apparatus for stress testing a computer memory system is disclosed. A sequential series of bit patterns, comprising 1's and 0's, is impressedd upon a computer memory so that, during testing, every memory cell stores a 1 while the eight adjacent neighboring memory cell stores 0's. Subsequently, the complimentary bit patterns are impressed upon memory, wherein every memory cell, at some time during the test, stores a 0 while the eight immediately adjacent neighboring memory cells store 1's. The disclosed bit pattern maximizes stress on the cells. In an interleaved dual memory bank configuration, memory cells are sequentially accessed from the highest to the lowest address of one memory bank, while memory cells are sequentially accessed from the lowest to the highest memory address in the other memory bank. Toggling successive memory accesses between the dual interleaved memory banks maximizes stress on the address driver components of the computer memory system. Preferably, the dual memory banks are simultaneously tested with complementary bit patterns to also maximize stress on the data bus driver and associated components and to maximize demand on the power supply system.

10 Claims, 13 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

Pattern 1

| | | | | | | | | | | | | | | | |
|---|---|---|---|---|---|---|---|---|---|---|---|---|---|---|---|
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |

Pattern 2

FIG. 3

| | | | | | | | | | | | | | | | |
|---|---|---|---|---|---|---|---|---|---|---|---|---|---|---|---|
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |

Pattern 3

FIG. 4

| | | | | | | | | | | | | | | | |
|---|---|---|---|---|---|---|---|---|---|---|---|---|---|---|---|
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |

Pattern 4

FIG. 5

| | | | | | | | | | | | | | | | |
|---|---|---|---|---|---|---|---|---|---|---|---|---|---|---|---|
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 1 | 0 | 0 | 0 |
| 0 | 0 | 1 | 0 | 0 | 0 | 0 | 0 | 1 | 0 | 0 | 0 | 0 | 0 | 1 | 0 |
| 0 | 0 | 0 | 0 | 1 | 0 | 0 | 0 | 0 | 0 | 1 | 0 | 0 | 0 | 0 | 0 |

Pattern 5

FIG. 6

| | | | | | | | | | | | | | | | |
|---|---|---|---|---|---|---|---|---|---|---|---|---|---|---|---|
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 0 | 0 | 0 | 1 | 0 | 0 |
| 0 | 0 | 0 | 1 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 1 | 0 | 0 | 0 | 0 |

Pattern 6

FIG. 7

| | | | | | | | | | | | | | | | |
|---|---|---|---|---|---|---|---|---|---|---|---|---|---|---|---|
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |

Pattern 7

FIG. 8

| | | | | | | | | | | | | | | | |
|---|---|---|---|---|---|---|---|---|---|---|---|---|---|---|---|
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |

Pattern 8

FIG. 9

| | | | | | | | | | | | | | | | |
|---|---|---|---|---|---|---|---|---|---|---|---|---|---|---|---|
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |

Pattern 9

FIG. 10

| | | | | | | | | | | | | | | | |
|---|---|---|---|---|---|---|---|---|---|---|---|---|---|---|---|
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |

Pattern 10

FIG. 11

| | | | | | | | | | | | | | | | |
|---|---|---|---|---|---|---|---|---|---|---|---|---|---|---|---|
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |
| 0 | 1 | 1 | 1 | 1 | 1 | 0 | 1 | 1 | 1 | 1 | 1 | 0 | 1 | 1 | 1 |
| 1 | 1 | 0 | 1 | 1 | 1 | 1 | 1 | 0 | 1 | 1 | 1 | 1 | 1 | 0 | 1 |
| 1 | 1 | 1 | 1 | 0 | 1 | 1 | 1 | 1 | 1 | 0 | 1 | 1 | 1 | 1 | 1 |

Pattern 11

FIG. 12

| | | | | | | | | | | | | | | | |
|---|---|---|---|---|---|---|---|---|---|---|---|---|---|---|---|
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |
| 1 | 0 | 1 | 1 | 1 | 1 | 1 | 0 | 1 | 1 | 1 | 1 | 1 | 0 | 1 | 1 |
| 1 | 1 | 1 | 0 | 1 | 1 | 1 | 1 | 1 | 0 | 1 | 1 | 1 | 1 | 1 | 0 |
| 1 | 1 | 1 | 1 | 1 | 0 | 1 | 1 | 1 | 1 | 1 | 0 | 1 | 1 | 1 | 1 |

Pattern 12

FIG. 13

METHOD AND APPARATUS FOR PATTERN SENSITIVITY STRESS TESTING OF MEMORY SYSTEMS

This application includes appendices entitledd: Appendix A—"Source Code for Pattern Sensitivity Testing" including 12 pages, and Appendix B—Pseudo-Code for Pattern Sensitivity Test Process, comprising 1 page.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

BACKGROUND OF THE INVENTION

1. Field of the Invention

The present invention relates to the field of testing the integrity and reliability of computer memory systems. More particularly, the present invention relates to stress testing modern high speed interleaved computer memory systems for active neighborhood pattern sensitivity faults ("ANPSF") and passive neighborhood pattern sensitivity faults ("PNPSF").

2. Description of Related Art

Solid state random access memory ("RAM") is one of the most important components of modern high speed computers. As operating systems and application programs become increasingly complex, they demand more and faster RAM. Therefore, much engineering effort has been directed toward increasing the storage capacity of RAM (i.e., increasing the number of storage cells in a RAM chip) while simultaneously decreasing RAM access times and physical size.

Unfortunately, however, as the number of memory cells within a given memory chip increases, so does the probability that the chip may contain a non-functioning cell. If the operating system, for example, encounters a malfunctioning memory cell, computer operation may be halted and critical data may be lost. Failures in the components of memory address drivers may have similar negative consequences. Therefore, there exists a need for efficient and effective methods to locate problems with RAM memory and associated address driver components during the computer manufacturing process, so as to eliminate, or at least minimize, memory malfunctions during normal customer operation.

In an effort to locate non-functioning components of address drivers and memory storage cells, and components and cells which are prone to fail during normal computer operation, test engineers have developed tests which subject such components to stresses in excess of that which would be expected during normal operation. For example, memory test algorithms which access memories with converging addresses stress the components that address the storage cells of the memory chips. A typical test of this type makes its first access to the lowest memory address within the test range, the second memory access to the highest memory address within the test range, the third access to the next to lowest address, the fourth access to the next highest and so forth. Eventually, the addresses being accessed converge at the middle of the physical memory. This method of stepping the chip addressing back and forth while the memory is under test is often referred to as "butterfly addressing." Butterfly addressing algorithms in the past were typically applied to March test algorithms. March test algorithms perform read/write/read operations on each memory location as they progress through memory. Alternating the addresses in this fashion maximizes the number of 0 to 1 and 1 to 0 transitions on the memory address lines, and therefore maximizes associated power consumption and concomitant stress on the components that access the memory cells.

As the physical size of RAM memory decreases, charge leakage between adjacent memory cells becomes the primary failure mode. Therefore, creating stress on the intercell physical paths between near neighbor cells is a important goal of test engineers. However, because of the extremely large number of different combinations of static and dynamic states that can exist among and between the eight cells immediately adjacent a target cell under test, such tests have been impossible to completely realize without using algorithms for addressing the memory that degrade raw performance of a memory test to the point that the time required to execute the tests cannot be justified for the benefits gained. The article by Magdy S. Abadir and Hassan K. Reghbati, Computing Surveys, Vol 15, No. 3, September 1983, describes some of the requirements for such memory pattern sensitivity testing.

IEEE Transactions on Computers, Vol. C-26, No. 11 (November 1977), pp. 1141–1144 by Knaizuk and Hartmann, discloses a test algorithm that exploits pattern sensitivity testing in a "neighborhood of five." The term "neighborhood of five" refers to the total number of memory cells involved in a test adjacent to and including a particular target cell. In a grid of memory cells, a neighborhood of five includes the target cell, the cells immediately above and below the target cell and the cells immediately to the sides of the target cell. Neighborhood of five testing, however, fails to test for charge leakage between the target cell and diagonally adjacent cells.

With today's memory chips achieving ever increasing higher density, the possible leakage paths between meory cells becomes shorter and shorter. As the memory cell density increases, the probability of the most common memory fault becoming a leakage path to a neighboring memory cell increases. Thus, testing of the "neighborhood of nine" memory cells for leakage between all adjacent cells, including diagonally adjacent cells, becomes very important.

SUMMARY OF THE INVENTION

This invention provides methods and apparatus for pattern sensitivity and address stress testing og memory systems. The invention provides a test procedure that accomplishes a complex but efficient "neighborhood of nine" pattern sensitivity test. The term "neighborhood of nine" refers to the total number of nearest neighbor memory cells tested immediately adjacent to and including a target cell. Simultaneously, the invention stresses the system with an address stress test which produces the stress of "butterfly addressing", but in a distinctly different manner. For the purpose of this disclosure (and to avoid confusion with prior art techniques) the inventive address stress testing technique described hereinafter will be referred to as "pseudo-butterfly addressing". "Butterfly addressing" refers generally to a procedure wherein successive memory accesses are made to widely disparate physical locations within a computer memory system.

If desired, the invention may be used to separately or simultaneously:

(1) Provide address driver and system power stress testing;

(2) Accomplish complete neighborhood of nine pattern sensitivity testing to assure that there are no passive neighborhood pattern sensitivity faults;

(3) Detect active neighborhood pattern sensitivity faults without jeopardizing the viability of the test algorithm from excessive complexity or long run time; and (4) Provide a test algorithm uniquely suited to a multi-bank interleaved computer memory system.

This invention may be used to test for both Passive Neighborhood Pattern Sensitivity Faults (PNPSF) and Active Neighborhood Pattern Sensitivity Faults (ANPSF). ANPSF refers to faults which result from a change in the state of a memory cell. PNPSF refers to memory cell malfunctions which occur because of a particular static memory pattern impressed upon a memory chip.

The inventive neighborhood of nine pattern sensitivity test stresses a given target cell with eight neighbor memory cells that are in the opposite state, so as to provide the maximum charge differential between the target cell and the eight nearest neighbor adjacent cells, and thereby the greatest opportunity for charge leakage.

For a method viewpoint, the invention involves the following steps:

(1) Write to the target cell to see if a write operation to that cell is possible, and that it does not create a disturbance (i.e., a change in state) in any of the eight nearest neighbor cells:

(2) Read the target cell's eight nearest neighbors to detect any disturbance caused by the write operation to the target cell and also to test the possibility that reading a neighbor cell might disturb the target cell; and (3) Read the target cell to verify that no disturbance occurred while reading the target cells eight nearest neighbors.

From a first alternative method viewpoint, the invention involves the following steps:

(1) Write a specific pattern to all eight neighbor cells in a neighborhood of nine cells;

(2) Write all target cells to a compliment pattern (where 0 is the complement of 1 and 1 is the complement of 0);

(3) Read all neighborhood cells to see if the target cell writes created any disturbance in the neighborhood;

(4) Read all target cells to see if reading the neighbor cells disturbed any target cells; and (5) Repeat each of steps 1–4 until all possible cells of a neighborhood of nine cells become a target cell, thereby testing for the ability of each cell to hold either a 0 or a 1 while the maximum charge disturbance is created in the neighborhood of each such target cell.

(6) Repeat steps (1) through (5) with the complimentary pattern of 0s and 1s.

The invention requires 12 iterations of steps 1 through 4 above to completely test all static pattern combinations.

From a third alternative method viewpoint, when the invention is used in a memory system having multiple (for example, two) banks of interleaved physical memory units, the test sequence in the pattern sensitivity stress test for interleaved memory includes the following steps:

(1) Write all memory including both target (foreground) cells and neighbor (background) cells to the same state to validate memory;

(2) Write the target cell of each modulo 6 frame to attempt to disturb its nearest eight neighbors. The writes are accomplished during a scan of one memory bank from the lowest target memory cell address ascending to the highest target memory cell address. The other memory bank being similarly scanned from the highest to lowest target cell address, while alternating memory accesses between memory banks. (Note that this step only requires writing one sixth of the memory under test);

(3) Read the eight neighbor (background) cells immediately adjacent to each target (foreground) cell, scanning one memory bank from the lowest memory address ascending to the highest memory address, alternating between accesses to each memory bank, the other memory bank being scanned from the highest memory address descending to the lowest memory address. Toggling accesses between the two memory banks using this pseudo-butterfly addressing technique maximizes stress on the address drivers and the system power source. Unlike the prior technique, however, the addresses do not converge in the middle of a single physical memory chip. This read of the entire memory is done to detect any cell disturbance in either the target (foreground) or neighbor (background) cells. During this time the invention may, if desired, utilize error correction code (ECC) to detect single bit correctable errors in a manner known in the art. In all cases target (foreground) and neighbor (background) cells should preferably contain data that is a complement of the other;

(4) Restore the target (foreground) cells to the same pattern as the neighbor (background) cells. Again, this only requires writing one sixth of the memory under test. If the sixth cell of the modulo 6 memory frame is currently the target, the entire memory is written to the complement of the neighbor (background) state;

(5) Sequence to the next sequential cell within the modulo 6 memory frame or start over with the complementary test pattern if all six cells of the modulo 6 memory frame have been tested; and (6) After sequencing to the next cell target, perform the preceding steps 2 through 5.

All six cells of the modulo 6 memory frame are tested in the above manner twice, once to test with target cells as 1's, and once to test target cells as 0's. Therefore, twelve iterations of the above process are needed to target each cell both in a neighborhood of 1's and in a neighborhood of 0's.

BRIEF DESCRIPTION OF THE DRAWINGS

The invention will now be described with reference to the accompanying drawings, wherein:

FIGS. 2–7 sequentially illustrate the bit pattern progression in a small 16×16 memory cell array using the neighborhood of nine test sequence, wherein the 1 bits are the "foreground" or target bits and the 0 bits form the "background" or non-target bits.

FIGS. 8–13 illustrate the complimentary bit pattern progression in the same small 16×16 memory cell, wherein the 0 bits comprise the "foreground" or target bits and the 1 bits comprise the "background" or non-target bits.

DETAILED DESCRIPTION OF THE PREFERRED EMBODIMENTS

The following description is of the best presently contemplated modes of carrying out the invention. This description is made for the purpose of illustrating the general principles of the invention and is not to be taken in a limiting sense.

Figure 1:
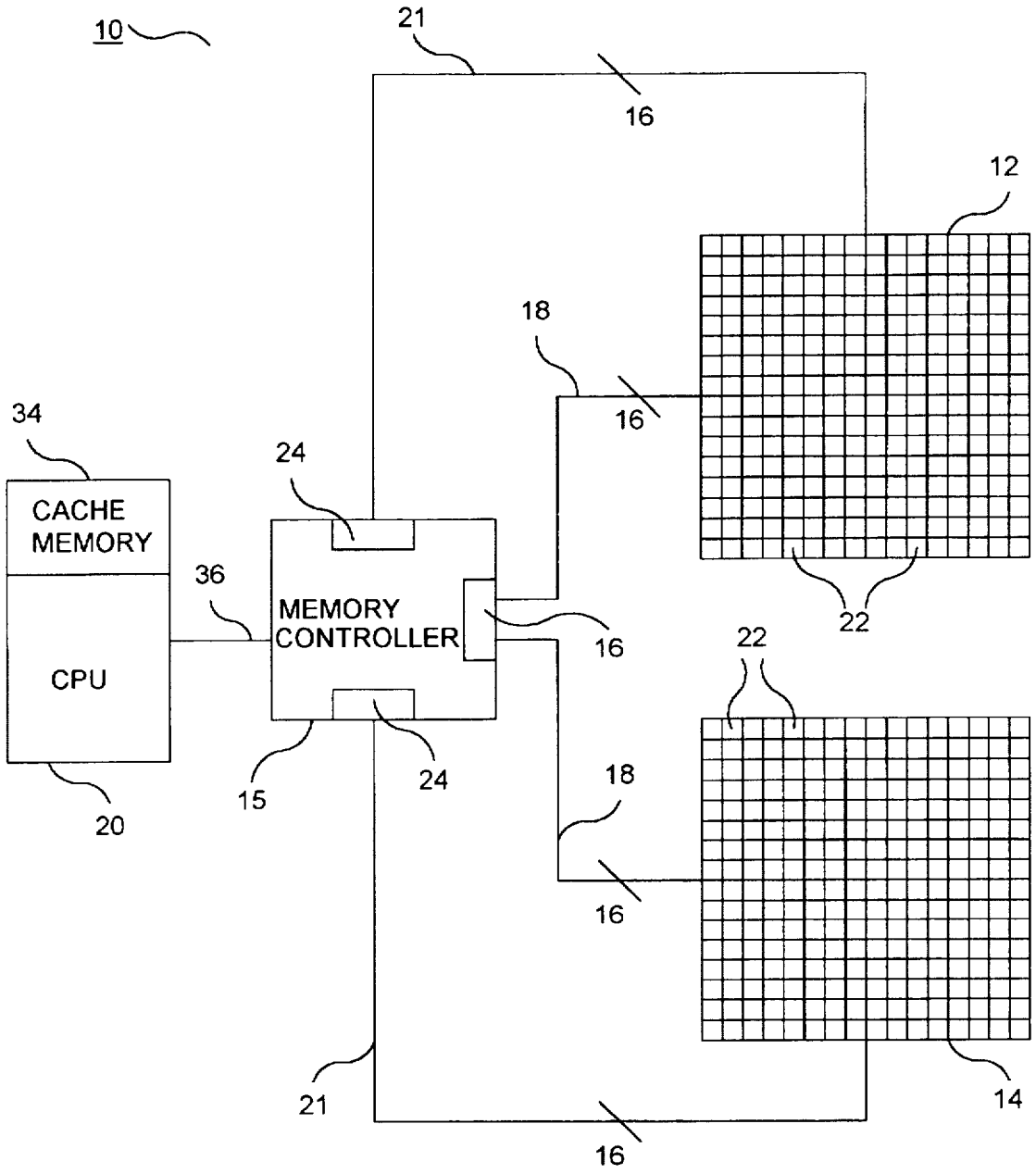
FIG. 1 illustrates a computer memory system, including a memory controller having an address driver, data bus driver and two interleaved solid state RAM memory chips.

FIG. 1 illustrates the architecture of a computer memory system 10 utilizing interleaved dual memory banks 12, 14. In accordance with a method known to those trained in the computer memory field, a memory controller 15 including an address driver 16 transmits signals along address lines 18 in response to instructions from CPU 20. As memory cells 22 are addressed, in accordance with signals from address driver 16, each memory cell 22 is read from and written to via signals transmitted along the data bus 21 from the data bus driver 24 also in a manner known to those trained in the computer memory field.

Memory accesses require a certain fixed set-up time and, therefore, many high speed computer memory systems now use "interleaved memory," wherein sequential memory accesses occur first to one memory bank 12 then to the other memory bank 14. In this way, memory access times are effectively decreased since a memory read or write operation can take place in one memory bank 12 while the other memory bank 14 is being set up for the next succeeding memory access.

FIGS. 2–13 illustrate a preferred embodiment of the present invention operative in a small 16×16 memory celll array. The 16×16 array is used for illustrative purposes; practical computer memories, of course, tend to be significantly larger.

In the 16×16 cell array illustration, FIGS. 2–13 show the twelve sequential patterns written into the array. One can readily see how the eight neighbors of a given target cell are in the opposite state from the target cells. The cells containing 1's are totally surrounded by 0's, even in locations that are on diagonals from the target cells. That is, each of eight neighbors in the neighborhood of nine cells are of the opposite state from the target cells. With the twelve patterns of the test, each cell in the array in turn becomes surrounded with cells of the opposite state, for both the 0's and 1's cases. The illustrations of FIGS. 2–13 shows the contents of a bit slice one bit wide in one bank of the memory under test. A 16×16 memory was chosen for illustration ease, although the same principle applies to memory arrays of any size that are addressed modulo two.

The algorithm specifically described herein is implemented for a two bank interleaved memory system, as shown in FIG. 1, but is readily adaptable to non-interleaved memory systems or memory systems with interleave greater than two.

Figure 2:
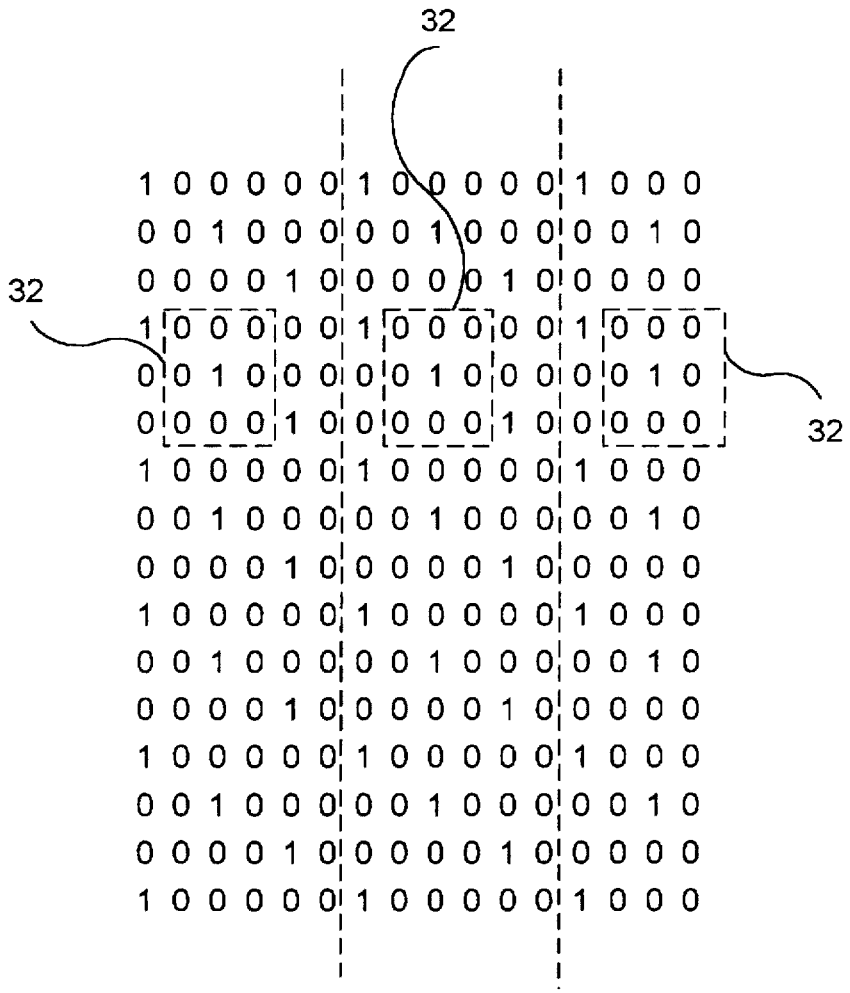

Passive Pattern Testing:

As illustrated b the vertical dashed lines in FIG. 2, a neighborhood of nine test scenario can be developed in a memory system that is addressed modulo 2 by subdividing memory horizontally into groups of cells modulo 6. A modulo 6 cell group may be referred to in this description of the test algorithm as a "frame". The specific cell under test is referred to as the target cell.

With reference to FIG. 2, the initial test pattern puts a 1 into the first target cell of each frame and 0's into each of the other five cells of the frame. Imaginary squares 32 illustratively surround three neighborhoods of nine adjacent memory cells. To cover the possibilities of each cell within a frame being a 1 with the other eight cells being 0's requires storing six different pattern sequences into memory. FIG. 3–7 illustrate each of these subsequent sequences. Six additional sequences, illustrated in FIGS. 8–13, are required to make each cell within a frame be a 0 with 1's in the other five cells of the frame. A total of twelve test sequences, with the unique patterns illustrated in FIGS. 2–13 collectively, are required to make each of the cells of the "neighborhood of nine" become a target cell holding a 0 and a 1.

The process for impressing the various illustrated memory patterns on to the memory banks 12.14 is driven by a software program which runs on a CPU 20 (FIG. 1). The instructions comprising this program are preferably stored in cache memory 34 separate from the memory 12.14 under test. The CPU 20 provides instructions to the address driver 16 and to a data bus driver 24 to cause memory I/O to be performed on each of the memory cells 22 under control of the software program.

A presently preferred program for accomplishing the memory test process disclosed herein is contained in Appendix A attached hereto and incorporated herein by reference. This program is written in C computer programming language and will be readily understood by one of ordinary skill in the relevant technological field. To further elucidate a presently preferred embodiment of the subject invention, Appendix B, which is also attached hereto and incorporated herein by reference, contains pseudo code for the stress testing process.

As implemented by the software program of Appendix A, the memory test procedure includes the major steps of:

(1) Writing all 0's into both memory banks:

(2) Write a 1 into each group of modulo 6 memory cells in one of the memory banks according to the bit pattern illustrated in FIGS. 2–7 and in a first direction of memory addresses (e.g., increasing memory addresses) and write the same bit pattern into the other memory bank, except in the reverse direction of memory addresses;

(3) Truncate the bit pattern at the end of memory if the end of memory does not coincide exactly with the end of a pattern sequence;

(4) Read all of memory and compare the originally written pattern with the pattern as now read;

(5) If any miscompares are located, the software logs an error so that appropriate action may be taken. Depending upon the circumstances, and severity of the problem, the test technician may replace the memory chip, address driver or other failed component, or the CPU may be instructed to avoid the page of memory containing the failed memory cell.

(6) Write one-sixth of memory by overwriting all 1's with 0's.

(7) Re-write the original pattern of 1's and 0's into memory, but in this step the modulo 6 bit pattern is shifted by one memory cell. (Again ony one-sixth of memory is written, thereby making this process exceptionally fast).

(8) Read the entire memory looking for miscompares between the pattern written in step 7 above and the pattern read in this step 8 and report any problems for appropriate action.

(9) Repeat steps 2–8 until all memory cells are written with a 1.

(10) Repeat steps 1 through 9 with the complementary bit pattern.

(11) Alternate all memory accesses between the two interleaved memory banks according to the previously described pseudo-butterfly addressing technique such that, at any one time, the two memory banks are being tested with complementary patterns—i.e., one memory bank contains a bit pattern composed predominantly of 1's and the other memory bank contains a bit pattern composed primarily of 0's.

Pseudo-Butterfly Stress Testing:

An important aspect of this invention in some preferred embodiments is that the process may be run on a multi-bank (interleaved) memory system. Interleaved memory systems are necessary to achieve the high memory bus data rates required by today's high performance computers.

An aspect of certain specific preferred embodiments of the present invention includes the use of a type of butterfly addressing technique. This memory test process simultaneously undertakes to perform a pattern sensitivity test that stresses paths to the nearest eight neighbors of a given memory cell (neighborhood of nine), as set forth previously, while simultaneously gaining the benefits of additional stress testing by alternately addressing multiple memory banks—one memory bank sequentially from the highest address to the lowest address while alternately accessing the other memory bank from the lowest address to the highest address. This aspect of the invention thus succeeds in combining the stress induced by previously known "butterfly addressing" sequences (but in a very different way) with a complex "neighborhood of nine" pattern sensitivity test.

The process implemented by the software program of Appendix A is optimized for a two bank memory system such as that shown in FIG. 1., wherein one of the memory banks, e.g. 12, is tested (i.e., addressed during the test) sequentially from the lowest address toward the highest address. The other of the two memory banks, e.g., 14, is tested from the highest address toward the lowest address.

It will be understood that, since the presently preferred embodiment duscussed herein is implemented in an interleaved dual memory bank memory system, the "pseudo-butterfly addressing" sequence discussed herein differs significantly from the butterfly addressing techniques discussed previously. In particular, wherein in prior techniques subsequent memory accesses alternated between low and high memory addresses and ultimately converged at a memory address in the middle of a single memory chip, the present addressing technique sweeps continuously from a high memory address to a low memory address of a single memory chip. However, from the point of view of an address driver, sequential memory accesses occur first to one memory bank and subsequently to another and different alternate interleaved memory bank. Increased stress on the memory driver components, however, is achieved notwithstanding a continuously increasing or decreasing memory address access to a single memory bank because sequential memory accesses occur between different memory banks and the different memory banks are alternately accessed from a high to low memory address and from a low to high memory address, respectively. Thus, address driver output approaches the maximum stress condition of a simultaneously switched outputs ("SSO").

In some systems pseudo-butterfly addressing will induce a considerable increase in overall noise in the power supply because of the increased switching which is induced in the output of the address driver 16 and data bus driver 21. In a worst case scenario pseudo-butterfly addressing may even cause noticeable "ground shift" in the power system. In any event, the results of the pattern sensitivity stress testing disclosed herein may be useful to test engineers in improving the design of the computer memory and power systems, as well as in locating single faults in memory chips.

Several preferred embodiments of the present invention have been described. Nevertheless, it will be understood that various modifications may be made without departing from the spirit and scope of the invention. For example, the invention may be utilized in interleaved computer memory systems having more than two interleaved memory banks. Alternatively, the method and apparatus of the present invention may be adapted for use in a computer system having a single memory bank. Furthermore, patterns other than those specifically disclosed as preferred in the application may be used to create stress in a computer memory subsystem so as to assist in the identification of existing faults and the identification of components likely to fail during normal use of the computer. Memory protected by an eror correcting code (ECC), although helpful, is not an essential component of the inventions described herein. The pseudo-butterfly memory accessing technique described herein may be used during some or all memory access passes through memory in an interleaved computer memory system. Thus, the present invention is not limited to the preferred embodiments described herein, but may be altered in a variety of ways which will be apparent to persons skilled in the art.

List of Appendices

Appendix A—"C Language Source Code Listing For Pattern Sensitivity Testing"

Appendix B—"Pseudo-code For Pattern Sensitivity Testing Process"

APPENDIX A

```
/* This file prepared with tabstop=4 */

#include "local.h"

/*LINTLIBRARY*/

/* Declare externals */
extern MTEST_PARM mtest_parms;
extern MEM_ERR mem_err_log;
extern U8 lookupchip[1024];
extern U8 lookupbit[1024];
extern U32 current_group;
extern CME_MAP cmap;
extern MDP_PTR mdpp;
extern MIC_PTR mp;
extern U32 CMEdumparea[164];


/* Declare local variables */
static int fg_position; /* Foreground pattern moves for each step */


/* psen():
***********************************************************************
                P S E U D O - B U T T E R F L Y
      N E I G H B O R H O O D   O F   N I N E   P A T T E R N
          S E N S I T I V I T Y   M E M O R Y   T E S T

The code that follows is implemented for a two bank memory system.
The even bank gets tested from lowest address to highest address,
the odd bank gets tested from highest address to lowest address.
The even bank gets tested with zeros pattern while the odd bank
is getting tested with foxes and visa versa.  By testing the opposite
banks with complementary patterns we more nearly approach SSO action
on the IBus.
*******************************************************************

Caveats: The Memory Test Parameters structure members "major_cnt"
  and "minor_cnt" are used differently in this test than other
  tests such as pwrfail.  In psen(), "major_cnt" is:
  ((range/12)-1) instead of (range/12).
  Similiarly "minor_cnt" is:
  ((range%12)+6) instead of (range%12).

Returns:  A return code to signal Error or No Error.
*******************************************************************/
int psen( void )
{
        register VU32 *lo_ptr;      /* Start address for even bank ops */
        register VU32 *hi_ptr;      /* Start address for odd bank ops  */
```

```
51              register int count;        /* Loop counting variable          */
52              register U32 u, v, bg ,fg; /* Working variables               */
53
54              static int loop_cnt;       /* Loop for 12 different patterns  */
55
56              /* First, initialize the Memory Test Parameters structure */
57              if (mtest_parms.eadr == 0) {
58                      u = LT_ADR;
59                      v = RdMemSize - 12;
60              } else {
61                      u = mtest_parms.sadr & ~7;       /* Must be Even Bank */
62                      v = (mtest_parms.eadr & ~7) | 4; /* Must be Odd Bank  */
63                      if (u < mtest_parms.sadr)
64                              u += 8;
65                      if (v > mtest_parms.eadr)
66                              v -= 8;
67                      if (u >= v)
68                              return (-1); /* Bail-out, if test range too narrow */
69              } /* END IF_ELSE */
70
71      #       ifdef REAL_ADR
72              mtest_parms.begptr = lo_ptr = (VU32 *)u;
73              mtest_parms.endptr = hi_ptr = (VU32 *)v;
74      #       else
75              mtest_parms.begptr = lo_ptr = (VU32 *)(u | KSEG1);
76              mtest_parms.endptr = hi_ptr = (VU32 *)(v | KSEG1);
77      #       endif REAL_ADR
78
79              count = ((hi_ptr + 1) - lo_ptr) >> 1;      /* # DWDs in test range */
80              mtest_parms.range = count;
81              u = count / 6;        /* Calculate # of pattern sensitivity frames */
82              v = count % 6;        /* Calculate # of words in the partial frame */
83
84              /* Slight adjustment to major_cnt and minor_cnt is necessary to allow
85              the memory read function in this test to work correctly.          */
86              if (u != 0) {
87                      mtest_parms.major_cnt = u - 1; /* Shorten fast loops slightly  */
88                      mtest_parms.minor_cnt = v + 6; /* Lengthen slow loops slightly */
89              } else {                  /* Cannot test very short address ranges */
90                      return (-1);          /* Bail-out, if test range too narrow.   */
91              } /* END IF-ELSE */
92              /* Finished initializing Memory Test Parameters structure..........*/
93
94              bg = 0;      /* Background pattern */
95              fg = ~0;     /* Foreground pattern */
96              loop_cnt = 0;
97              while (loop_cnt < 12) {
98                      fg_position = loop_cnt % 6;
99                      loop_cnt++;
100                     PROGRESS(loop_cnt);
```

```
101
102     #               ifdef   CME_DETAIL
103                     MAPZCME(count);
104     #               endif   CME_DETAIL
105
106                     CHECK4CME;
107
108                     /* Memory validation required on first and seventh loop. */
109                     if (loop_cnt == 1 || loop_cnt == 7) {
110                             lo_ptr = mtest_parms.begptr;
111                             hi_ptr = mtest_parms.endptr;
112                             count = mtest_parms.range;
113
114                             while (count != 0)  {
115                                     *lo_ptr = bg;   /* VALIDATE WRITE EVEN BANK */
116                                     *hi_ptr = fg;   /* VALIDATE WRITE ODD BANK */
117                                     count--;
118                                     lo_ptr += 2;
119                                     hi_ptr -= 2;
120                             } /* END WHILE */
121                     } /* END IF */
122
123                     lo_ptr = mtest_parms.begptr + (fg_position << 1);
124                     hi_ptr = mtest_parms.endptr - (fg_position << 1);
125                     count = mtest_parms.major_cnt;
126
127                     while (count != 0)  {
128                             *lo_ptr = fg;   /* WRITE EVEN BANK FOREGROUND */
129                             *hi_ptr = bg;   /* WRITE ODD BANK FOREGROUND */
130                             count--;
131                             lo_ptr += 12;
132                             hi_ptr -= 12;
133                     } /* END WHILE */
134
135                     count = mtest_parms.minor_cnt - fg_position;
136
137                     while (count > 0)  {
138                             *lo_ptr = fg;   /* WRITE EVEN BANK FOREGROUND */
139                             *hi_ptr = bg;   /* WRITE ODD BANK FOREGROUND */
140                             count -= 6;
141                             lo_ptr += 12;
142                             hi_ptr -= 12;
143                     } /* END WHILE */
144
145                     /********** Now read back what we just wrote **************
146                     Foreground pattern is written into each Pattern Sensitivity
147                     Frame in such a way as to create the cell surrounded by
148                     bits of the opposite state. Now read all of memory to see
149                     if there's been any cells disturbed. */
150
```

```
151                     /* The following "switch" causes just enough memory to be read
152                     to bring us into alignment with the memory location that
153                     has the foreground pattern written in it.  Reading these
154                     few locations is what caused us to have to make slight
155                     adjustments of "major_cnt" and "minor_cnt" when we initialized
156                     them.  Of the six locations in the pattern sensitivity
157                     generation frame, only one of them will contain the
158                     foreground pattern.  The variable fg_position shows how far
159                     the foreground pattern is skewed from the start of the
160                     memory pattern sensitivity frame. */
161
162                     lo_ptr = mtest_parms.begptr;
163                     hi_ptr = mtest_parms.endptr;
164                     switch (fg_position) {
165                     case 5:
166                             u = *lo_ptr;                    /* R E A D */
167                             v = *hi_ptr;                    /* R E A D */
168                             lo_ptr += 2;
169                             if (u != bg) {
170                                     mem_err_log.inuse_flag = 34;
171                                     mem_err_log.erradr = (U32)(lo_ptr-2);
172                                     mem_err_log.expected = bg;
173                                     mem_err_log.received = u;
174                                     mem_err_log.misc1 = loop_cnt;
175                                     return (34);
176                             } /* END IF */
177                             hi_ptr -= 2;
178                             if (v != fg) {
179                                     mem_err_log.inuse_flag = 33;
180                                     mem_err_log.erradr = (U32)(hi_ptr+2);
181                                     mem_err_log.expected = fg;
182                                     mem_err_log.received = v;
183                                     mem_err_log.misc1 = loop_cnt;
184                                     return (33);
185                             } /* END IF */
186                             /* Intentionally no break here */
187                     case 4:
188                             u = *lo_ptr;                    /* R E A D */
189                             v = *hi_ptr;                    /* R E A D */
190                             lo_ptr += 2;
191                             if (u != bg) {
192                                     mem_err_log.inuse_flag = 32;
193                                     mem_err_log.erradr = (U32)(lo_ptr-2);
194                                     mem_err_log.expected = bg;
195                                     mem_err_log.received = u;
196                                     mem_err_log.misc1 = loop_cnt;
197                                     return (32);
198                             } /* END IF */
199                             hi_ptr -= 2;
200                             if (v != fg) {
```

```
                                        mem_err_log.inuse_flag = 31;
                                        mem_err_log.erradr = (U32)(hi_ptr+2);
                                        mem_err_log.expected = fg;
                                        mem_err_log.received = v;
                                        mem_err_log.misc1 = loop_cnt;
                                        return (31);
                                } /* END IF */
                                /* Intentionally no break here */
                        case 3:
                                u = *lo_ptr;                    /* R E A D */
                                v = *hi_ptr;                    /* R E A D */
                                lo_ptr += 2;
                                if (u != bg) {
                                        mem_err_log.inuse_flag = 30;
                                        mem_err_log.erradr = (U32)(lo_ptr-2);
                                        mem_err_log.expected = bg;
                                        mem_err_log.received = u;
                                        mem_err_log.misc1 = loop_cnt;
                                        return (30);
                                } /* END IF */
                                hi_ptr -= 2;
                                if (v != fg) {
                                        mem_err_log.inuse_flag = 29;
                                        mem_err_log.erradr = (U32)(hi_ptr+2);
                                        mem_err_log.expected = fg;
                                        mem_err_log.received = v;
                                        mem_err_log.misc1 = loop_cnt;
                                        return (29);
                                } /* END IF */
                                /* Intentionally no break here */
                        case 2:
                                u = *lo_ptr;                    /* R E A D */
                                v = *hi_ptr;                    /* R E A D */
                                lo_ptr += 2;
                                if (u != bg) {
                                        mem_err_log.inuse_flag = 28;
                                        mem_err_log.erradr = (U32)(lo_ptr-2);
                                        mem_err_log.expected = bg;
                                        mem_err_log.received = u;
                                        mem_err_log.misc1 = loop_cnt;
                                        return (28);
                                } /* END IF */
                                hi_ptr -= 2;
                                if (v != fg) {
                                        mem_err_log.inuse_flag = 27;
                                        mem_err_log.erradr = (U32)(hi_ptr+2);
                                        mem_err_log.expected = fg;
                                        mem_err_log.received = v;
                                        mem_err_log.misc1 = loop_cnt;
                                        return (27);
```

```
251                             } /* END IF */
252                             /* Intentionally no break here */
253                     case 1:
254                             u = *lo_ptr;                    /* R E A D */
255                             v = *hi_ptr;                    /* R E A D */
256                             lo_ptr += 2;
257                             if (u != bg) {
258                                     mem_err_log.inuse_flag = 26;
259                                     mem_err_log.erradr = (U32)(lo_ptr-2);
260                                     mem_err_log.expected = bg;
261                                     mem_err_log.received = u;
262                                     mem_err_log.misc1 = loop_cnt;
263                                     return (26);
264                             } /* END IF */
265                             hi_ptr -= 2;
266                             if (v != fg) {
267                                     mem_err_log.inuse_flag = 25;
268                                     mem_err_log.erradr = (U32)(hi_ptr+2);
269                                     mem_err_log.expected = fg;
270                                     mem_err_log.received = v;
271                                     mem_err_log.misc1 = loop_cnt;
272                                     return (25);
273                             } /* END IF */
274                             /* Intentionally no break here */
275                     case 0: default:
276                             break;
277                     } /* END SWITCH */
278
279                     count = mtest_parms.major_cnt;
280
281                     while (1) {
282                             if (0 == count) break;
283                             count--;
284                             u = *lo_ptr;                    /* R E A D */
285                             v = *hi_ptr;                    /* R E A D */
286                             lo_ptr += 2;
287                             if (u != fg) {
288                                     mem_err_log.inuse_flag = 24;
289                                     mem_err_log.erradr = (U32)(lo_ptr-2);
290                                     mem_err_log.expected = fg;
291                                     mem_err_log.received = u;
292                                     mem_err_log.misc1 = loop_cnt;
293                                     return (24);
294                             } /* END IF */
295                             u = *lo_ptr;                    /* R E A D */
296                             hi_ptr -= 2;
297                             if (v != bg) {
298                                     mem_err_log.inuse_flag = 23;
299                                     mem_err_log.erradr = (U32)(hi_ptr+2);
300                                     mem_err_log.expected = bg;
```

```
                        mem_err_log.received = v;
                        mem_err_log.misc1 = loop_cnt;
                        return (23);
                } /* END IF */
                v = *hi_ptr;                    /* R E A D */
                lo_ptr += 2;
                if (u != bg) {
                        mem_err_log.inuse_flag = 22;
                        mem_err_log.erradr = (U32)(lo_ptr-2);
                        mem_err_log.expected = bg;
                        mem_err_log.received = u;
                        mem_err_log.misc1 = loop_cnt;
                        return (22);
                } /* END IF */
                u = *lo_ptr;                    /* R E A D */
                hi_ptr -= 2;
                if (v != fg) {
                        mem_err_log.inuse_flag = 21;
                        mem_err_log.erradr = (U32)(hi_ptr+2);
                        mem_err_log.expected = fg;
                        mem_err_log.received = v;
                        mem_err_log.misc1 = loop_cnt;
                        return (21);
                } /* END IF */
                v = *hi_ptr;                    /* R E A D */
                lo_ptr += 2;
                if (u != bg) {
                        mem_err_log.inuse_flag = 20;
                        mem_err_log.erradr = (U32)(lo_ptr-2);
                        mem_err_log.expected = bg;
                        mem_err_log.received = u;
                        mem_err_log.misc1 = loop_cnt;
                        return (20);
                } /* END IF */
                u = *lo_ptr;                    /* R E A D */
                hi_ptr -= 2;
                if (v != fg) {
                        mem_err_log.inuse_flag = 19;
                        mem_err_log.erradr = (U32)(hi_ptr+2);
                        mem_err_log.expected = fg;
                        mem_err_log.received = v;
                        mem_err_log.misc1 = loop_cnt;
                        return (19);
                } /* END IF */
                v = *hi_ptr;                    /* R E A D */
                lo_ptr += 2;
                if (u != bg) {
                        mem_err_log.inuse_flag = 18;
                        mem_err_log.erradr = (U32)(lo_ptr-2);
                        mem_err_log.expected = bg;
```

```
                        mem_err_log.received = u;
                        mem_err_log.misc1 = loop_cnt;
                        return (18);
                } /* END IF */
                u = *lo_ptr;                    /* R E A D */
                hi_ptr -= 2;
                if (v != fg) {
                        mem_err_log.inuse_flag = 17;
                        mem_err_log.erradr = (U32)(hi_ptr+2);
                        mem_err_log.expected = fg;
                        mem_err_log.received = v;
                        mem_err_log.misc1 = loop_cnt;
                        return (17);
                } /* END IF */
                v = *hi_ptr;                    /* R E A D */
                lo_ptr += 2;
                if (u != bg) {
                        mem_err_log.inuse_flag = 16;
                        mem_err_log.erradr = (U32)(lo_ptr-2);
                        mem_err_log.expected = bg;
                        mem_err_log.received = u;
                        mem_err_log.misc1 = loop_cnt;
                        return (16);
                } /* END IF */
                u = *lo_ptr;                    /* R E A D */
                hi_ptr -= 2;
                if (v != fg) {
                        mem_err_log.inuse_flag = 15;
                        mem_err_log.erradr = (U32)(hi_ptr+2);
                        mem_err_log.expected = fg;
                        mem_err_log.received = v;
                        mem_err_log.misc1 = loop_cnt;
                        return (15);
                } /* END IF */
                v = *hi_ptr;                    /* R E A D */
                lo_ptr += 2;
                if (u != bg) {
                        mem_err_log.inuse_flag = 14;
                        mem_err_log.erradr = (U32)(lo_ptr-2);
                        mem_err_log.expected = bg;
                        mem_err_log.received = u;
                        mem_err_log.misc1 = loop_cnt;
                        return (14);
                } /* END IF */
                hi_ptr -= 2;
                if (v != fg) {
                        mem_err_log.inuse_flag = 13;
                        mem_err_log.erradr = (U32)(hi_ptr+2);
                        mem_err_log.expected = fg;
                        mem_err_log.received = v;
```

```
                                        mem_err_log.misc1 = loop_cnt;
                                        return (13);
                                } /* END IF */
                        } /* END WHILE */

                        count = mtest_parms.minor_cnt - fg_position;

                        while (0 != count) {
                                count--;
                                u = *lo_ptr;                    /* R E A D */
                                v = *hi_ptr;                    /* R E A D */
                                lo_ptr += 2;
                                if (u != fg) {
                                        mem_err_log.inuse_flag = 12;
                                        mem_err_log.erradr = (U32)(lo_ptr-2);
                                        mem_err_log.expected = fg;
                                        mem_err_log.received = u;
                                        mem_err_log.misc1 = loop_cnt;
                                        return (12);
                                } /* END IF */
                                hi_ptr -= 2;
                                if (v != bg) {
                                        mem_err_log.inuse_flag = 11;
                                        mem_err_log.erradr = (U32)(hi_ptr+2);
                                        mem_err_log.expected = bg;
                                        mem_err_log.received = v;
                                        mem_err_log.misc1 = loop_cnt;
                                        return (11);
                                } /* END IF */
                                if (0 == count) break;
                                count--;
                                u = *lo_ptr;                    /* R E A D */
                                v = *hi_ptr;                    /* R E A D */
                                lo_ptr += 2;
                                if (u != bg) {
                                        mem_err_log.inuse_flag = 10;
                                        mem_err_log.erradr = (U32)(lo_ptr-2);
                                        mem_err_log.expected = bg;
                                        mem_err_log.received = u;
                                        mem_err_log.misc1 = loop_cnt;
                                        return (10);
                                } /* END IF */
                                hi_ptr -= 2;
                                if (v != fg) {
                                        mem_err_log.inuse_flag = 9;
                                        mem_err_log.erradr = (U32)(hi_ptr+2);
                                        mem_err_log.expected = fg;
                                        mem_err_log.received = v;
                                        mem_err_log.misc1 = loop_cnt;
                                        return (9);
```

```
451                     } /* END IF */
452                     if (0 == count) break;
453                     count--;
454                     u = *lo_ptr;                    /* R E A D */
455                     v = *hi_ptr;                    /* R E A D */
456                     lo_ptr += 2;
457                     if (u != bg) {
458                             mem_err_log.inuse_flag = 8;
459                             mem_err_log.erradr = (U32)(lo_ptr-2);
460                             mem_err_log.expected = bg;
461                             mem_err_log.received = u;
462                             mem_err_log.misc1 = loop_cnt;
463                             return (8);
464                     } /* END IF */
465                     hi_ptr -= 2;
466                     if (v != fg) {
467                             mem_err_log.inuse_flag = 7;
468                             mem_err_log.erradr = (U32)(hi_ptr+2);
469                             mem_err_log.expected = fg;
470                             mem_err_log.received = v;
471                             mem_err_log.misc1 = loop_cnt;
472                             return (7);
473                     } /* END IF */
474                     if (0 == count) break;
475                     count--;
476                     u = *lo_ptr;                    /* R E A D */
477                     v = *hi_ptr;                    /* R E A D */
478                     lo_ptr += 2;
479                     if (u != bg) {
480                             mem_err_log.inuse_flag = 6;
481                             mem_err_log.erradr = (U32)(lo_ptr-2);
482                             mem_err_log.expected = bg;
483                             mem_err_log.received = u;
484                             mem_err_log.misc1 = loop_cnt;
485                             return (6);
486                     } /* END IF */
487                     hi_ptr -= 2;
488                     if (v != fg) {
489                             mem_err_log.inuse_flag = 5;
490                             mem_err_log.erradr = (U32)(hi_ptr+2);
491                             mem_err_log.expected = fg;
492                             mem_err_log.received = v;
493                             mem_err_log.misc1 = loop_cnt;
494                             return (5);
495                     } /* END IF */
496                     if (0 == count) break;
497                     count--;
498                     u = *lo_ptr;                    /* R E A D */
499                     v = *hi_ptr;                    /* R E A D */
500                     lo_ptr += 2;
```

```
                        if (u != bg) {
                                mem_err_log.inuse_flag = 4;
                                mem_err_log.erradr = (U32)(lo_ptr-2);
                                mem_err_log.expected = bg;
                                mem_err_log.received = u;
                                mem_err_log.misc1 = loop_cnt;
                                return (4);
                        } /* END IF */
                        hi_ptr -= 2;
                        if (v != fg) {
                                mem_err_log.inuse_flag = 3;
                                mem_err_log.erradr = (U32)(hi_ptr+2);
                                mem_err_log.expected = fg;
                                mem_err_log.received = v;
                                mem_err_log.misc1 = loop_cnt;
                                return (3);
                        } /* END IF */
                        if (0 == count) break;
                        count--;
                        u = *lo_ptr;                    /* R E A D */
                        v = *hi_ptr;                    /* R E A D */
                        lo_ptr += 2;
                        if (u != bg) {
                                mem_err_log.inuse_flag = 2;
                                mem_err_log.erradr = (U32)(lo_ptr-2);
                                mem_err_log.expected = bg;
                                mem_err_log.received = u;
                                mem_err_log.misc1 = loop_cnt;
                                return (2);
                        } /* END IF */
                        hi_ptr -= 2;
                        if (v != fg) {
                                mem_err_log.inuse_flag = 1;
                                mem_err_log.erradr = (U32)(hi_ptr+2);
                                mem_err_log.expected = fg;
                                mem_err_log.received = v;
                                mem_err_log.misc1 = loop_cnt;
                                return (1);
                        } /* END IF */
                } /* END WHILE */

                /* After the sixth loop, we swap the fg and bg patterns,
                then test six more loops with the new fg and bg patterns.
                Typically, the patterns are zeros and foxes but some
                other patterns could also create the cell surround as
                well. */
                if (loop_cnt != 6) {
                        if (loop_cnt == 12)
                                break;
                        lo_ptr = mtest_parms.begptr + (fg_position << 1);
```

```
                        hi_ptr = mtest_parms.endptr - (fg_position << 1);
                        count = mtest_parms.major_cnt;

                        while (count != 0) {
                                *lo_ptr = bg;   /* RESTORE WRITE EVEN BANK */
                                *hi_ptr = fg;   /* RESTORE WRITE ODD BANK */
                                count--;
                                lo_ptr += 12;
                                hi_ptr -= 12;
                        } /* END WHILE */

                        count = mtest_parms.minor_cnt - fg_position;

                        while (count > 0)  {
                                *lo_ptr = bg;   /* RESTORE WRITE EVEN BANK */
                                *hi_ptr = fg;   /* RESTORE WRITE ODD BANK */
                                count -= 6;
                                lo_ptr += 12;
                                hi_ptr -= 12;
                        } /* END WHILE */
                } else { /* After the sixth loop, we swap the fg and bg
                        patterns, then test six more loops with the new
                        foreground and background patterns.  Typically, the
                        patterns are zeros and foxes but some other patterns
                        would also create the cell surround as well. */
                        bg ^= fg;
                        fg ^= bg;
                        bg ^= fg;
                } /* END IF-ELSE */
        }  /* END WHILE - LOOP-COUNT LOOP*/


#       ifdef   CME_DETAIL
        MAPZCME(count);
#       endif   CME_DETAIL

        CHECK4CME;
        return ( 0 );
} /* END FUNCTION */
```

APPENDIX B

```
**********************************************************************
              P S E U D O   B U T T E R F L Y
    N E I G H B O R H O O D   O F   N I N E   P A T T E R N
        S E N S I T I V I T Y   M E M O R Y   T E S T
P S E U D O   C O D E   F O R   D U A L   B A N K   M E M O R Y
**********************************************************************
BEGIN (PSEN)
 even bank pattern = zeros (see note 1)
 odd bank pattern = ones (see note 1)
 FOR even bank = first address to last address (see note 2)
  FOR odd bank = last address to first address (see note 2)
   Write validate even bank = even bank pattern
   Write validate odd bank = odd bank pattern
  NEXT address decending
 NEXT address ascending
 FOR pattern count = 0 to 11  (12 patterns)
  FOR even bank = first address to last address (see note 2)
   FOR odd bank = last address to first address (see note 2)
    Write even bank target cell = even bank pattern complement
    Write odd bank target cell = odd bank pattern complement
   NEXT address decending
  NEXT address ascending
  FOR even bank = first address to last address (see note 2)
   FOR odd bank = last address to first address (see note 2)
    Read even bank target cell
     if data read not = even bank pattern complement ** Error 1 **
    Read odd bank target cell
     if data read not = odd bank pattern complement ** Error 1 **
    Read even bank neighborhood cells
     if data read not = even bank pattern ** Error 1 **
    Read odd bank neighborhood cells
     if data read not = odd bank pattern ** Error 1 **
   NEXT address decending
  NEXT address ascending
  FOR even bank = first address to last address (see note 2)
   FOR odd bank = last address to first address (see note 2)
    Write restore even bank target = even bank pattern
    Write restore odd bank target = odd bank pattern
   NEXT address decending
  NEXT address ascending
   Increment pattern count by one
   IF pattern count = 6  (Validate memory to complement patterns)
      even bank pattern = complement of even bank pattern
      odd bank pattern = complement of odd bank pattern
      FOR even bank = first address to last address (see note 2)
       FOR odd bank = last address to first address (see note 2)
        Write validate even bank = even bank pattern
        Write validate odd bank = odd bank pattern
       NEXT address decending
      NEXT address ascending
 NEXT pattern by count
END (PSEN)
Error 1: Possible Memory Pattern Sensitivity Error,
         Adr: xx, Expected Data: xx, Actual Data xx, Bad Bit(s): xx
Note 2: By using converging addressing (pseudo-butterfly), we cause
  aggressive switching of the system address bus that approaches
  as nearly as possible "simultaneously switched outputs" (SSO).
Note 1: By testing alternate banks with complementary patterns
  aggressive switching (near SSO) of the system data bus occurs.
```

What is claimed is:

1. A method for stress testing a memory system having a plurality of memory cells capable of being grouped in a plurality of neighborhoods of nine cells, each neighborhood of nine cells including a center cell and eight cells surrounding the center cell, the method comprising the steps of:

(a) writing all of the memory cells within a predetermined address range of the memory system with a first value;

(b) writing a plurality of target cells with a second value which is a complement of the first value, each of the target cells being a center cell of each of a first group of neighborhoods of nine cells within the address range, each of the target cells being surrounded by eight non-target cells;

(c) reading all of the non-target cells within the address range and reporting a failure condition if any non-target cells contain other than the first value; and (d) reading all of the target cells and reporting a failure condition if any target cells contain other than the second value.

2. The method of claim 1, further comprising the step of repeating the steps (a) to (d) until all of the cells within the address range have been written as target cells of a plurality groups of neighborhoods of nine cells.

3. The method of claim 2, further comprising the step of repeating the steps (a) to (d) with the second value written to all of the plurality of memory cells when the step (a) is performed and the first value written to the plurality of target cells when the step (b) is performed.

4. A system for stress testing a computer memory system having a plurality of memory cells arranged in a matrix pattern, comprising:

means for writing to a target cell within a neighborhood of 9 cells;

first means for reading the target cells 8 nearest neighbors, detecting a disturbance in the target cells 8 nearest neighbors and determining if the write to the target cells caused the disturbance;

second means for reading the target cell and determining whether a disturbance occurred in the target cell while the first means for reading read the 8 nearest neighbor cells.

5. A system for stress testing a memory system having a plurality of memory cells capable of being grouped in a plurality of neighborhoods of nine cells, each neighborhood of nine cells including a center cell and eight cells surrounding the center cell, the system comprising:

first writing means for writing all of the memory cells within a predetermined address range of the memory system with a first value;

second writing means for writing a plurality of target cells with a second value which is a complement of the first value, each of the target cells being a center cell of each of a first group of neighborhoods of nine cells within the address range, each of the target cells being surrounded by eight non-target cells;

first reading means for reading all of the non-target cells within the address range and reporting a failure condition if any non-target cells contain other than the first value; and second reading means for reading all of the target cells and reporting a failure condition if any target cells contain other than the second value.

6. The system of claim 5, further comprising means for causing the first and second writing means and the first and second reading means to repeat performing the writing and reading functions, respectively until all of the cells within the address range have been written as target cells of a plurality groups of neighborhoods of nine cells.

7. The system of claim 6, further comprising means for causing the first and second writing means and the first and second reading means to repeat performing the writing and reading functions, respectively with the first writing means writing the second value to all of the plurality of memory cells and the second writing means writing the first value to the plurality of target cells.

8. A computer program product comprising:

a computer usuable medium having computer readable code embodied therein for stress testing a memory system having a plurality of memory cells capable of being grouped in a plurality of neighborhoods of nine cells, each neighborhood of nine cells including a center cell and eight cells surrounding the center cell, the computer program product comprising:

computer readable program code devices configured to cause a computer effect performing a first writing function by writing all of the memory cells within a predetermined address range of the memory system with a first value;

computer readable program code devices configured to cause a computer effect performing a second writing function by writing a plurality of target cells with a second value which is a complement of the first value, each of a first group of target cells being a center cell of each of a first group of neighborhoods of nine cells within the address range, each of the target cells being surrounded by eight non-target cells;

computer readable program code devices configured to cause a computer effect performing a first reading function by reading all of the non-target cells within the address range and reporting a failure condition if any non-target cells contain other than the first value; and computer readable program code devices configured to cause a computer effect performing a second reading function by reading all of the target cells and reporting a failure condition if any target cells contain other than the second value.

9. The computer program product of claim 8, further comprising computer readable program code devices configured to cause a computer to effect repeating performing the first and second writing functions and the first and second reading functions until all of the cells within the address range have been written as target cells of a plurality groups of neighborhoods of nine cells.

10. The computer program product of claim 9, further comprising the computer readable program code devices configured to cause a computer to effect repeating performing the first and second writing functions and the first and second reading functions, with the second value written to all of the plurality of memory cells and the first value written to the plurality of target cells.

* * * * *